(12) United States Patent
Torii et al.

(10) Patent No.: US 11,627,665 B2
(45) Date of Patent: Apr. 11, 2023

(54) SCREEN PRINTER

(71) Applicant: FUJI CORPORATION, Chiryu (JP)

(72) Inventors: Atsushi Torii, Toyota (JP); Akira Furuichi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 35 days.

(21) Appl. No.: 16/628,322

(22) PCT Filed: Jul. 14, 2017

(86) PCT No.: PCT/JP2017/025653
§ 371 (c)(1),
(2) Date: Jan. 3, 2020

(87) PCT Pub. No.: WO2019/012681
PCT Pub. Date: Jan. 17, 2019

(65) Prior Publication Data
US 2020/0196454 A1    Jun. 18, 2020

(51) Int. Cl.
*B41F 15/18* (2006.01)
*H05K 3/12* (2006.01)
(Continued)

(52) U.S. Cl.
CPC ........... *H05K 3/1225* (2013.01); *B41F 15/18* (2013.01); *B41F 15/44* (2013.01); *H05K 3/0085* (2013.01); *H05K 2203/0139* (2013.01)

(58) Field of Classification Search
CPC .......... B41F 15/00; B41F 15/18; B41F 15/26; B41F 15/36; B41F 15/38; B41F 15/42;
(Continued)

(56) References Cited

U.S. PATENT DOCUMENTS 5,553,537 A    9/1996  Hara
5,553,538 A *  9/1996  Freitag ................. H05K 3/1233
                                            101/123
(Continued)

FOREIGN PATENT DOCUMENTS

JP    2003-211631 A       7/2003
JP    2007320207    * 12/2007  .............. B41F 15/36
(Continued)

OTHER PUBLICATIONS

International Search Report dated Sep. 19, 2017 in PCT/JP2017/025653 filed on Jul. 14, 2017, 2 pages.

*Primary Examiner* — Christopher E Mahoney
*Assistant Examiner* — Marissa Ferguson-Samreth
(74) *Attorney, Agent, or Firm* — Oblon, McClelland, Maier & Neustadt, L.L.P.

(57) ABSTRACT

A screen printer comprising: a conveyance device configured to convey a board; a board holding device configured to position a conveyed board at a printing position; a stencil holding device configured to attach a stencil above the held board; a squeegee device configured to fill pattern holes of the stencil with solder paste; a board raising and lowering device configured to raise and lower the board positioned by the board holding device; and a control device configured to perform drive control of each the above devices, the control device including a standby printing processing section configured to raise the board from below with respect to the stencil such that the board contacts the stencil, stand by in a state with solder paste filled in the pattern holes, and lower the board to separate the board from the stencil in accordance with a board conveyance signal.

3 Claims, 4 Drawing Sheets

(51) Int. Cl.
*B41F 15/44* (2006.01)
*H05K 3/00* (2006.01)

(58) Field of Classification Search
CPC ........ B41F 15/44; B41F 15/46; B41F 15/085; B41F 15/0813; B41F 15/0818; B41F 15/0881; H05K 3/0085; H05K 3/1225; H05K 3/1216; H05K 3/1233; H05K 2203/0139; H05K 2203/163
See application file for complete search history.

(56) References Cited

U.S. PATENT DOCUMENTS

| | | | | |
|---|---|---|---|---|
| 6,129,014 A * | 10/2000 | Tani | ........................ | B41F 15/16 |
| | | | | 101/126 |
| 9,398,696 B2 * | 7/2016 | Miyake | .................... | B41F 15/08 |
| 10,889,103 B2 * | 1/2021 | Kondo | .................... | B41F 15/26 |
| 2008/0006162 A1 * | 1/2008 | Willshere | ................ | B41F 15/18 |
| | | | | 101/126 |
| 2012/0090483 A1 * | 4/2012 | Willshere | ............. | H05K 3/1216 |
| | | | | 101/123 |
| 2014/0307236 A1 * | 10/2014 | Kobayashi | ............ | B41F 35/003 |
| | | | | 355/30 |

FOREIGN PATENT DOCUMENTS

| | | | | | |
|---|---|---|---|---|---|
| JP | 2011189673 | * | 9/2011 | .............. | B41F 15/36 |
| JP | 2013006584 | * | 6/2013 | .............. | B41F 15/36 |
| JP | 2016-86144 A | | 5/2016 | | |
| JP | 2016086144 | * | 5/2016 | ............... | H05K 3/34 |

\* cited by examiner

SCREEN PRINTER

TECHNICAL FIELD

The present application relates to a screen printer for improving print processing of solder paste onto a board via a stencil.

BACKGROUND ART

In a screen printer, a stencil is provided in which is formed a printing pattern made up of multiple pattern holes, and solder paste is spread over the stencil below which is a board. Printing onto the board is performed in the printing pattern by the solder paste that fills the pattern holes being applied to the board. Here, if the solder paste is not appropriately applied onto the board, problems may occur in a subsequent process of mounting electronic components. Thus, patent literature 1 below discloses a screen printer for preventing printing errors such as smearing or streaking of solder paste.

For example, with a screen printer, there are cases in which operation is stopped for a long period of time due to components running out at a component mounter or the like. However, the solder paste filled in the pattern holes of the stencil is not entirely transferred to the board during the print process, and solder paste adhering to the inner peripheral surface of the pattern holes remains as residual solder. The residual solder becomes more viscous when left in the pattern hole for an extended period of time, which causes problems such as preventing the pattern hole pattern from being filled with new solder paste, thereby leading to printing errors.

To counter this, in a conventional example of the patent literature, a screen printer is disclosed in which the board is separated from the stencil after a preset holding time has elapsed of a state with the pattern holes of the stencil being filled with solder paste. Specifically, the hole pattern of the stencil to which the residual solder is attached is filled with solder paste to be newly printed. Then, by waiting for a specified time to elapse in a state with the pattern holes filled with solder paste, the difference in the viscosity between the new solder paste and the residual solder paste is reduced. Accordingly, the residual solder paste adheres to the new solder paste that just filled the pattern hole to be integrated together, and the integrated solder paste is printed onto the board via the pattern hole.

CITATION LIST

Patent Literature

Patent literature 1: JP-A-2003-211631

BRIEF SUMMARY

Technical Problem

However, with this conventional technology, it is necessary to wait for a time until both solder pastes integrate with a small difference in viscosity. That is, the board cannot be separated from the stencil until a certain holding time has elapsed with the pattern holes filled with solder paste, which adds time to the print processing. In other words, with conventional technology, the time from the pattern holes of the stencil being filled with solder paste until lowering the board to separate it can be from one second to, in long cases, around one hour, when counting with a timer. This significantly reduces the efficiency of manufacturing the circuit board. In addition, since the setting of the holding time by the timer differs depending on various conditions, sufficient experience is required for the operator to make a decision about this. On the other hand, if the holding time is to be automatically calculated based on various parameters, the configuration and handling thereof become complicated.

In order to solve the above problems, an object of the present disclosure is to provide a screen printer in which print processing of solder paste is improved with a simple configuration.

Solution to Problem

A screen printer according to an aspect of the present disclosure includes: a conveyance device configured to convey a board; a board holding device configured to position a conveyed board at a printing position; a stencil holding device configured to attach a stencil above the held board; a squeegee device configured to fill pattern holes of the stencil with solder paste; a board raising and lowering device configured to raise and lower the board positioned by the board holding device; and a control device configured to perform drive control of each the above devices, the control device including a standby printing processing section configured to raise the board from below with respect to the stencil such that the board contacts the stencil, stand by in a state with solder paste filled in the pattern holes, and lower the board to separate the board from the stencil in accordance with a board conveyance signal.

Advantageous Effects

According to the above configuration, standby printing processing section raises the board from below with respect to the stencil such that the board contacts the stencil, stands by in a state with solder paste filled in the pattern holes, and lowers the board to separate the board from the stencil in accordance with a board conveyance signal. Therefore, even if a long time is required from the separation of a previous board to printing of a subsequent board, the residual solder does not dry and print processing is improved.

DESCRIPTION OF EMBODIMENTS

Figure 1:
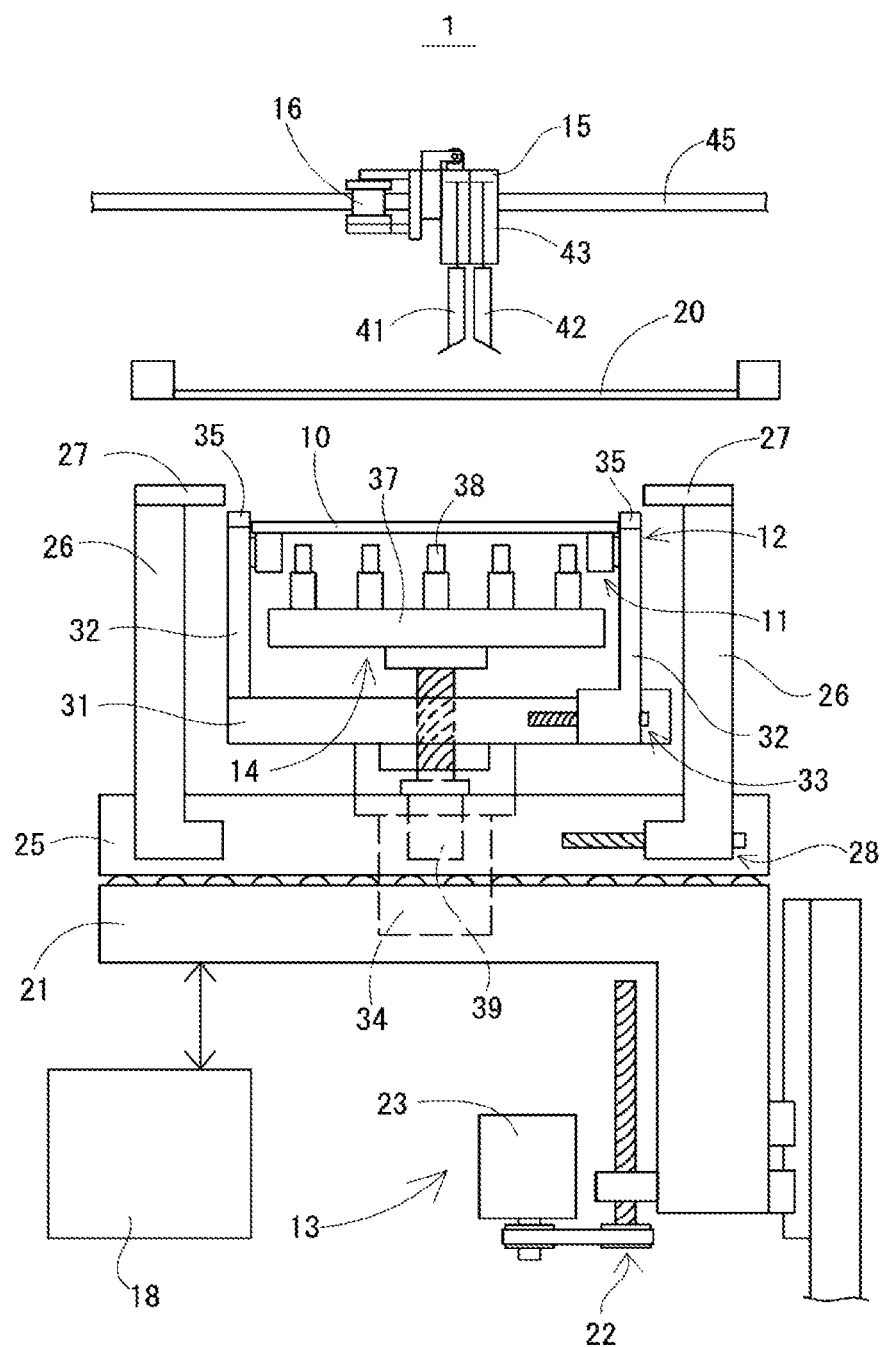
FIG. 1 shows an internal configuration of an embodiment of a screen printer.

Hereinafter, an embodiment of the present disclosure of a screen printer will be described with reference to the figures. FIG. 1 shows an internal configuration of an embodiment of a screen printer. Screen printer 1 constitutes a board production line together with an inspection machine, a component mounter, and the like. Thus, a board on which solder paste has been printed is conveyed to a subsequent process, then, at a downstream side, the print condition is inspected, electronic components are mounted, and the like. Screen printer 1 is covered by a main body cover, and by opening an opening/closing cover, it is possible to perform changeover such as stencil replacement and maintenance and the like in the main body.

The internal configuration of the screen printer shown in FIG. 1 is assembled in the main body. With screen printer 1, stencil 20 is attached via a stencil holder, and board 10 is conveyed below the stencil in the width direction of the main body (the direction perpendicular to the page). Board 10 is stopped and positioned at a printing position in the machine, and printing is performed by applying solder paste to board 10 in a predetermined pattern. For this, board conveyance device 11 for conveying board 10, clamp device 12 for clamping the board, and the like are arranged below stencil 20.

Board conveyance device 11 and clamp device 12 are assembled to raising and lowering device 13. With raising and lowering device 13, raising and lowering table 21 is connected to raising and lowering motor 23 via ball screw mechanism 22, and is vertically movable. A pair of stencil supports 26 are arranged on raising and lowering table via support table 25 in the front-rear direction of the main body (the left-right direction in the figure), and clamp device 12 is provided between the pair of stencil supports 26. Stencil support plates 27 to contact with stencil 20 are fixed on the upper surface of stencil supports 26. Ball screw mechanism 28 is provided on one of the mask supports 26 (the one on the right in the figure), with the distance from the other stencil support 26 being adjustable by controlling stencil support motor 47 (refer to FIG. 2).

Figure 2:
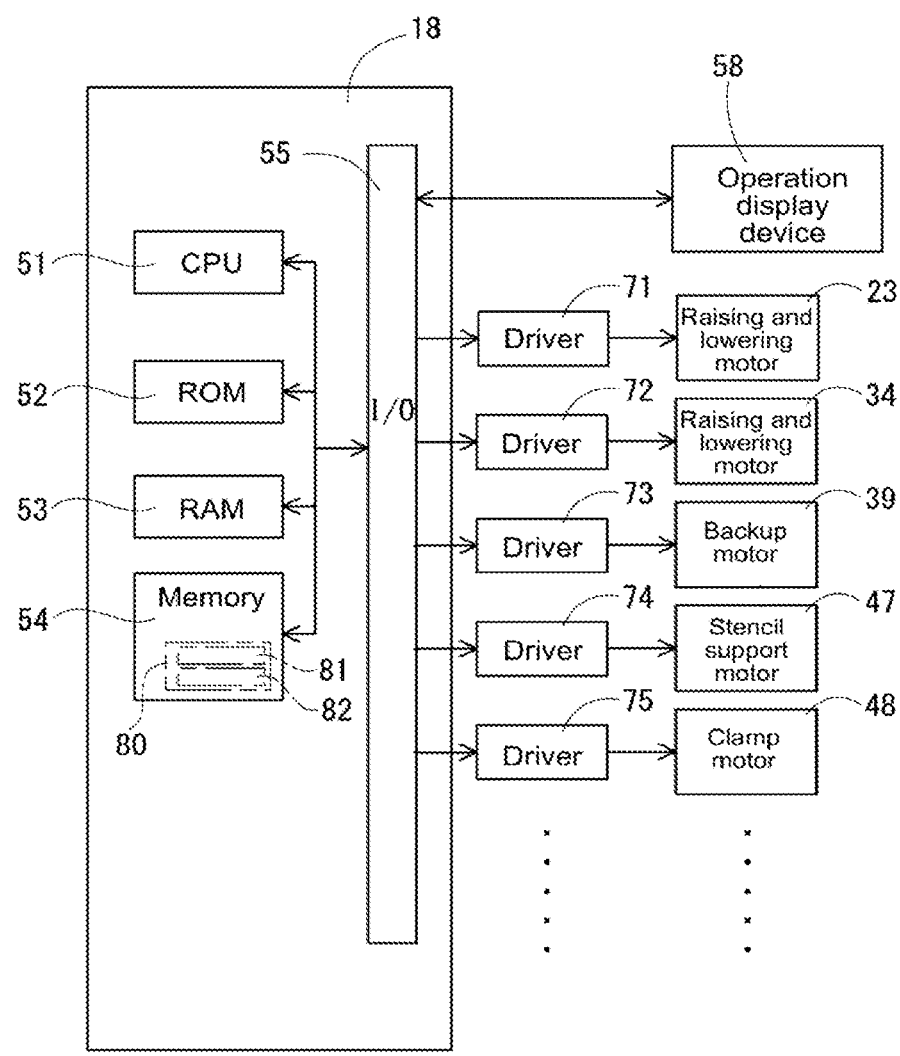
FIG. 2 is a simplified block diagram showing a control system of the screen printer.

With clamp device 12, a pair of side frames 32 is arranged on support table 31, and ball screw mechanism 33 is provided on one of the pair of side frames 32, with the distance between the two being adjustable by control of clamp motor 48 (refer to FIG. 2). Clamp section 35 is formed at the upper end of side frame 32 such that board 10 can be gripped by adjusting the distance between the side frames 32. Board conveyance device 11 configured from conveyor belts is assembled on the insides of both side frames 32, and backup device 14 is provided between the frames.

Backup device 14 is configured such that backup table 37 having multiple backup pins 38 is supported by a ball screw mechanism and raised and lowered by backup motor 39. Accordingly, board 10 is raised via backup pins 38. Further, support table 31 of clamp device 12 is supported via a ball screw mechanism and is configured to be raised and lowered by raising and lowering motor 34. Also, support table 25 supporting clamp device 12 and backup device 14 is configured to be adjustable in position with respect to raising and lowering table 21 in the X direction, the Y direction, and the θ direction of the XY horizontal plane.

Squeegee device 15 and solder supply device 16 are provided above mask 20. With squeegee device 15, pair of squeegee heads 41 and 42 provided with a squeegee is mounted on traveling body 43 so as to be able to be moved up and down by a cylinder. Also, squeegee device 15 is slidably attached to guide rail 45 on both sides of the main body. Guide rail 45 extends in the front-rear direction of the main body, and squeegee device 15 is movable in the same direction. Solder supply device 16 for discharging solder paste to stencil 20 is also slidably mounted on the same guide rail 45. Each of squeegee device 15 and solder supply device 16 is slidably assembled with respect to the two guide rails 45 by the respective traveling body 43 and moving table 46, and squeegee device 15 is configured with a drive mechanism such that traveling body 43 can move freely.

Screen printer 1 is equipped with control device 18 for performing overall drive control, and drive control of the respective devices. FIG. 2 is a simplified block diagram showing a control system of screen printer 1. Control device 18 is connected to microprocessor (CPU) 51, ROM 52, RAM 53, and nonvolatile memory 54 via bus lines. CPU 51 performs overall control of the entire control device, and ROM 52 stores system programs to be executed by CPU 51, control parameters, and the like, and RAM 53 stores temporary calculation data, display data, and the like.

Nonvolatile memory 54 stores information required for processing performed by CPU 51, and nonvolatile memory 54 stores sequence programs of screen printer 1 and the like. In particular, in the present embodiment, print processing program 80, which will be described later, and the like are stored. A touchscreen-panel-type operation display device 58 is attached to a front surface of screen printer 1, and allows an operator to perform an inputting operation such as switching modes, and displays manufacturing conditions on a screen. Control device 18 is connected to operation display device 58 via I/O port 55. Motors such as raising and lowering motor 23 are also connected to I/O port 55 via drivers 71 to 75.

Next, effects of screen printer 1 are described. With screen printer 1, first, board 10 loaded on the conveyor belts of board conveyance device 11 is conveyed to a printing position between pair of side frames 32. Then, backup table 37 is raised by backup motor 39 so as to push up to backup pins 38 such that board 10 is raised from the conveyor belts. Then, the distance between pair of side frames 32 is reduced such that board 10 is sandwiched by clamp section 35 and held in the printing position inside the printer. Further, clamp device 12 holding board 10 is raised by raising and lowering motor 34, and the positions of clamp section 35 and board 10 are aligned with the height of stencil support plate 27 such that the height of the upper surfaces are aligned.

Next, raising and lowering table 21 is raised by the driving of raising and lowering motor 23, and is stopped at a height at which the upper surfaces of clamp section 35 and board 10 lightly contact the lower surface of stencil 20. Solder paste on the upper surface of stencil 20 is rolled on the stencil 20 by squeegee device 15, so as to fill the pattern holes. Then, raising and lowering table 21 is lowered by the driving of raising and lowering motor 23, such that board 10 is separated from mask 20, and a printing pattern of solder paste is formed on board 10.

Figure 4:
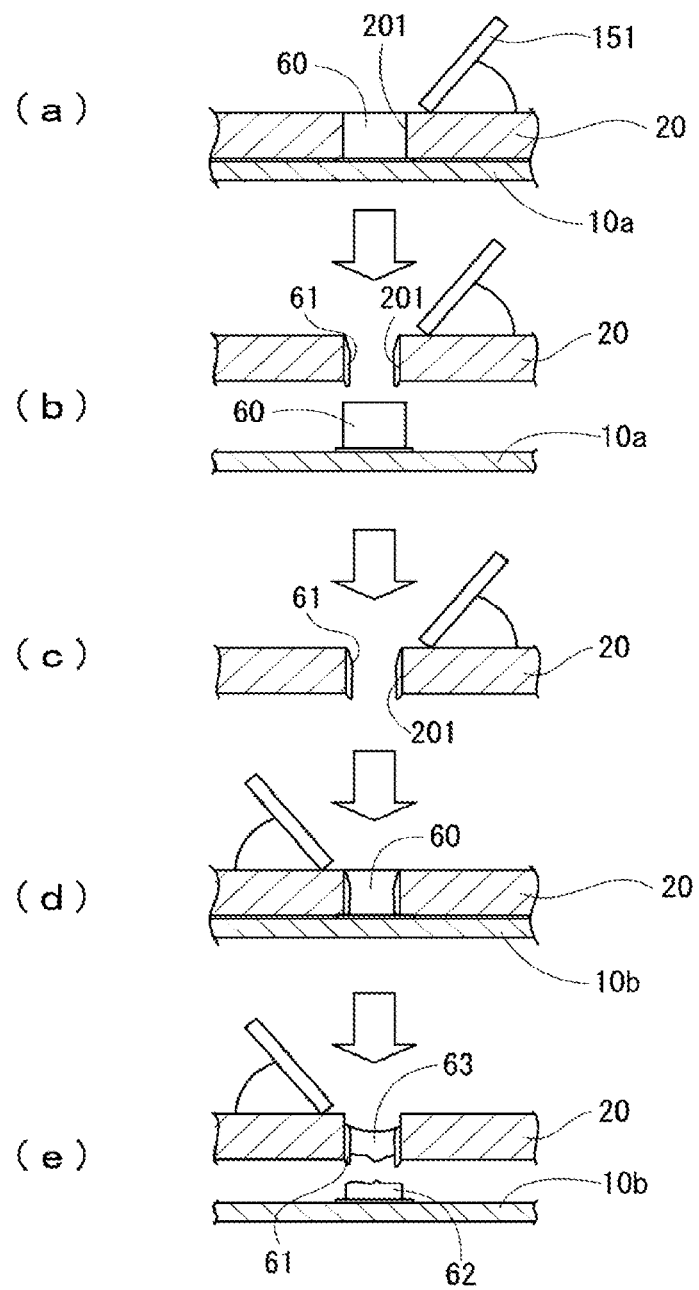
FIG. 4 illustrates steps of each print process when a normal print processing program is executed.

Note that, after the printing onto a board 10 is complete, if the time until printing on the next board 10 becomes long a printing error may occur on the next board 10 due to the problems describe earlier. With screen printer 1, there are not only cases when printing is repeated for a short time, but also cases when, for example, the stencil pattern is complicated and it takes a long time before the printing condition inspection or component mounting on the previous board 10 are completed, or when screen printer 1 stops for a long time due to an operator having a break. In such cases, if residual solder remains attached to a side surface of the pattern holes of stencil 20, the flux in the solder paste dries and a viscosity change occurs. The residual solder with the changed viscosity may adversely affect the printing of a subsequent board 10. FIG. 4 illustrates steps of each print process when a normal print processing program is executed and a printing error occurs.

First, in process (a), as described above, board 10a contacts the stencil from below, and pattern holes 201 of stencil 20 are filled with solder paste 60 by squeegee 151. Then, in process (b), board 10a is separated from the stencil by being lowered, and patterned solder paste 60 is printed on board 10a. At this time, not all of the solder paste 60 in pattern holes 201 is transferred to board 10a, and since the solder paste is viscous, residual solder 61 adheres to the inside surface of pattern holes 201 and remains in the holes.

Note that, board 10a for which printing is completed stands by in the screen printer without being conveyed if a mounting operation is being performed by a downstream-side component mounter. Therefore, if board 10a remains at the printing position, subsequent board 10b is not conveyed, so that stencil 20 is left for a long time in the state shown in step (c). Thus, residual solder 61 adhering to the inside surface of pattern holes 201 dries and the viscosity changes. Thereafter, when the board 10a is conveyed, the next board 10b is conveyed to the printing position, and board 10b is made to contact stencil 20 from below as shown in step (d).

Then, pattern holes 201 in which there is residual solder 61 are filled with new solder paste 60, and in the subsequent step (e), board 10b is separated from the stencil. When this occurs, all of the solder paste 60 should be printed onto board 10b, but in some cases only a portion of the solder paste, 62, may be printed, as shown. The resistance during separation was large due to the residual solder 61 drying and becoming more viscous, meaning that residual solder 61 remained in pattern hole 201 along with non-transferred solder 63. In this case, the volume of solder paste 61 printed onto board 10 is insufficient, leading to a printing error.

Figure 3:
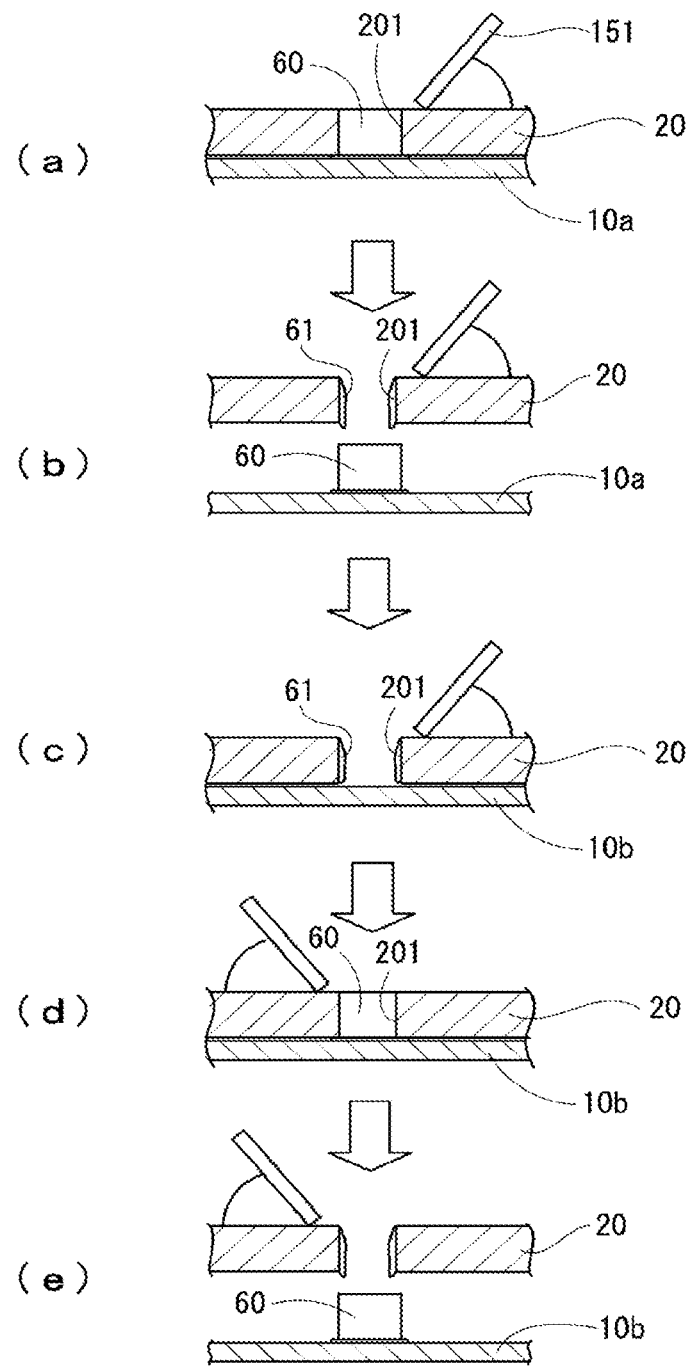
FIG. 3 illustrates steps of each print process when a standby print processing program is executed.

With respect to this, screen printer 1 of the present embodiment is provided with a function to perform good printing onto board 10 even if there is a long time from the completion of printing of previous board 10a and printing of subsequent board 10b. Specifically, print processing program 80 stored in control device 18 is characterized to control the timing at which board 10 is lowered so as to separate from stencil 20. Standby print processing program 81 for executing such control processing is stored in non-volatile memory 54, and FIG. 3 is a diagram showing each step when the program is executed.

First, in process (a), board 10a contacts stencil 20 from below, and pattern holes 201 of stencil 20 are filled with solder paste 60 by squeegee 151. Then, in process (b), board 10a is separated from the stencil by being lowered, and patterned solder paste 60 is printed on board 10a. Then, board 10a for which printing is complete is conveyed by the conveyors to a downstream-side inspection machine, a downstream-side component mounter, or the like.

With screen printer 1, since board 10a is conveyed downstream based on a board conveyance signal, the next board 10b is immediately loaded. The board conveyance signal is a signal indicating that board 10a for which printing is complete can be moved to a position downstream of the printing position. A board conveyance signal includes, for example, an unloading signal transmitted from a downstream device when a previous board processed prior to the board 10a completes processing in a device located downstream of screen printer 1 and is unloaded from the downstream device. Then, board 10b is made to contact stencil 20 from below as shown in process (c), and pattern holes 201 are filled with solder paste 60 as shown in process (d). Accordingly, even if residual solder 61 adheres to the inside surface of pattern holes 201 in process (b), pattern holes 201 are filled with new solder paste 60 within a short time. Subsequently, in a case in which inspection of the printing condition or component mounting for the previous board 10a takes a long time, or a case in which an operator takes a break, a standby state is maintained in process (d).

Board 10b is made to contact stencil 20 from below, and in a state with pattern holes 201 filled with solder paste 60, stands by until certain conditions are satisfied. In the present embodiment, the standby state of process (d) is maintained until a board conveyance request is received. Then, when a board conveyance request is received, proceeding to process (e), board 10b is lowered to be separated from stencil 20, and the board 10b for which printing is complete is conveyed downstream. Then, processes (c) to (e) are repeated. Here, the board conveyance request is, for example, a mounting complete signal transmitted from a component mounter located downstream of screen printer 1, or a board conveyance signal such as a print start signal inputted by an operator from operation display device 58 of screen printer 1.

In this manner, with standby print processing program 81 of the present embodiment, a standby state arises in process (d), and as shown in process (c) of FIG. 4, the viscosity of residual solder 61 inside pattern holes 201 is prevented from changing. Then, the standby state is released and the condition for performing separation of board 10, that is, print processing is sent as a board conveyance signal. In addition to a signal described above, the board conveyance signal may also be a signal indicating that the buffer space is available for printed board 10 in a case in which screen printer 1 has buffer space to hold printed board 10 on standby, or a detection signal from a detector that detects the presence or absence of a board in the buffer space.

Note that, print processing program 80 stored in control device 18 includes not only standby print processing program 81 for executing the print processing shown in FIG. 3, but also normal print processing program 82 for executing the print processing shown in FIG. 4. The execution of both programs can be switched between a standby printing mode and a normal printing mode. That is, the operator can freely select the print mode by performing a mode switching operation from the screen of operation display device 58.

Therefore, according to screen printer 1 of the present embodiment, by using standby printing mode, since board 10 is made to contact stencil 20, the pattern holes of stencil 20 are filled with solder paste, and then a standby is maintained, even if a long time is required from the separation of previous board 10a to the printing of the next board 10b, residual solder 61 does not dry, and appropriate printing can be performed. Further, screen printer 1 can achieve the above-mentioned effects while keeping the conventional structure as it is by simply changing print process program 80.

In addition, since the standby printing mode and the normal printing mode can be switched, efficient print processing can be selected according to the circuit board manufacturing content. In other words, when the interval between previous and subsequent printing is short and residual solder 61 in pattern holes 201 is not adversely affected, the normal printing mode can shorten the time required to convey the printed board 10 to the downstream side. In the standby printing mode, conveyance is performed after the board is separated from the stencil after receiving the board conveyance signal, but in the normal printing mode, the printed board 10 that has been separated from the stencil waits on the conveyor at the printing position, such that conveyance is performed as soon as possible.

The above describes an embodiment of the present disclosure, but embodiments are not limited to these and various changes may be employed without departing from the scope of the disclosure. For example, since the structure of the screen printer is merely an example, a screen printer with a different structure to that described in the conventional example may be used.

REFERENCE SIGNS LIST

1: screen printer;
10 (10a, 10b): board;
11: board conveyance device;
12: clamp device;
13: raising and lowering device;
14: backup device;
15: squeegee device;
18: control device;
60: solder paste;
61: residual solder

The invention claimed is:

1. A screen printer comprising:
a conveyor configured to convey a board;
a clamp configured to position a conveyed board at a printing position;
a stencil holder configured to attach a stencil above the board;
a squeegee configured to fill pattern holes of the stencil with solder paste;
a board raising and lowering device configured to raise and lower the board positioned by the clamp, the board raising and lowering device including a motor; and
processing circuitry configured to perform drive control of the conveyor, the clamp, the stencil holder, and the board raising and lowering device, the processing circuitry including a standby printing processing section configured to
control the board raising and lower device to raise the board from below with respect to the stencil such that the board contacts the stencil,
stand by in a standby state with solder paste filled in the pattern holes and the board in contact with the stencil, and
control the board raising and lower device to lower the board from the standby state to separate the board from the stencil when the processing circuitry receives a board conveyance signal that indicates the board is requested to be moved downstream by the conveyor and a next board is to be raised to the stencil by the board raising and lowering device, the board conveyance signal including an unloading signal from a downstream device indicating that a previous board is unloaded from the downstream device.

2. The screen printer according to claim 1, wherein
the processing circuitry is configured to lower the board to separate the board from the stencil when the processing circuitry receives the board conveyance signal issued from another machine or the board conveyance signal that is issued from the screen printer.

3. The screen printer according to claim 1, wherein
the processing circuitry is provided with a normal print processing section configured control the board raising and lower device to raise the board from below with respect to the stencil such that the board contacts the stencil, then lower the board after the pattern holes have been filled with solder paste without standing by, and to hold the board in a lowered state until receiving the board conveyance signal, and
the processing circuitry is configured to switch to and from print processing by the standby printing processing section and the normal print processing section.

* * * * *